(12) United States Patent
Nozadze et al.

(10) Patent No.: US 10,674,598 B1
(45) Date of Patent: Jun. 2, 2020

(54) MEASURING EFFECTIVE DIELECTRIC CONSTANT USING VIA-STUB RESONANCE

(71) Applicant: CISCO TECHNOLOGY, INC., San Jose, CA (US)

(72) Inventors: David Nozadze, San Jose, CA (US); Amendra Koul, San Francisco, CA (US); Joel Richard Goergen, Soulsbyville, CA (US); Mike Sapozhnikov, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/596,623

(22) Filed: Oct. 8, 2019

(51) Int. Cl.
*H05K 1/02* (2006.01)
*H05K 1/11* (2006.01)
*H01P 3/08* (2006.01)
*H05K 3/40* (2006.01)
*H01P 11/00* (2006.01)
*H01P 7/08* (2006.01)
*H05K 3/00* (2006.01)

(52) U.S. Cl.
CPC ........... *H05K 1/0251* (2013.01); *H01P 3/081* (2013.01); *H01P 7/082* (2013.01); *H01P 11/008* (2013.01); *H05K 1/024* (2013.01); *H05K 1/0222* (2013.01); *H05K 1/115* (2013.01); *H05K 3/0005* (2013.01); *H05K 3/4038* (2013.01); *H05K 2201/09609* (2013.01); *H05K 2201/09627* (2013.01); *H05K 2201/10151* (2013.01); *H05K 2203/163* (2013.01)

(58) Field of Classification Search
CPC ............... H05K 1/0251; H05K 1/0253; H05K 1/0222–0228; H05K 1/024; H05K 1/115; H05K 3/0005; H05K 3/0011; H01P 7/082
See application file for complete search history.

(56) References Cited

U.S. PATENT DOCUMENTS

| | | | |
|---|---|---|---|
| 2004/0174228 A1* | 9/2004 | Kanno | ................... H01L 23/66 333/34 |
| 2005/0098348 A1* | 5/2005 | Okumichi | ......... H01L 23/49827 174/262 |

(Continued)

FOREIGN PATENT DOCUMENTS

CN             105163483 B     4/2018

OTHER PUBLICATIONS polarinstruments.com, Via Pad / Anti-Pad Impedance Calculation, Jul. 5, 2019.

(Continued)

*Primary Examiner* — Hoa C Nguyen
(74) *Attorney, Agent, or Firm* — Cindy Kaplan

(57) ABSTRACT

In one embodiment, an apparatus includes a printed circuit board, a via-stub resonator formed in the printed circuit board, a plurality of vias surrounding the via-stub resonator, and a microstrip connected to the via-stub resonator for use in measuring an insertion loss to provide a resonance frequency. The via-stub resonator is designed to reproduce a dielectric constant value of a known material in a simulation. A via dielectric constant in an x and y plane is calculated based on the resonance frequency. A method for measuring the via dielectric constant using the via-stub resonator is also disclosed herein.

20 Claims, 9 Drawing Sheets

(56) References Cited

U.S. PATENT DOCUMENTS

| | | | |
|---|---|---|---|
| 2007/0130555 A1* | 6/2007 | Osaka | H04L 25/08 439/14 |
| 2007/0193775 A1 | 8/2007 | Chen | |
| 2008/0013295 A1* | 1/2008 | Kuramitsu | H01L 23/66 361/763 |
| 2010/0019859 A1* | 1/2010 | Lascari | H01P 1/047 333/33 |
| 2010/0065321 A1* | 3/2010 | Kashiwakura | H05K 1/0222 174/261 |
| 2011/0001584 A1* | 1/2011 | Enokihara | H01P 1/2088 333/208 |
| 2011/0057853 A1* | 3/2011 | Kim | H01Q 1/48 343/843 |
| 2011/0079422 A1* | 4/2011 | Kushita | H05K 1/0245 174/266 |
| 2015/0359084 A1* | 12/2015 | Kashiwakura | H01P 3/026 333/246 |

OTHER PUBLICATIONS

Semanticscholar.org, Impedance Matching in Multi-Layer Interconnect Structures to Minimize Signal Reflections in High Speed Applications, Soorya Krishna K, M. S. Bhat, Jun. 2012, pp. 345-349.

Semanticscholar.org, A Fast and Accurate Method for Measuring the Dielectric Constant of Printed Wiring Board Materials, Nicholas G. Paulter, Jul. 1996, pp. 214-225.

B.L. Givot ; J. Krupka ; K. Derzakowski, Split-post dielectric resonator for Complex permittivity measurements at 20-25 GHz, 14th International Conference on Microwaves, Radar and Wireless Communications. MIKON—2002. Conference Proceedings (IEEE Cat.No. 02EX562).

Y. Shlepnev, A. Neves, T. Dagostino, S. McMorrow, Practical identification of dispersive dielectric models with generalized modal S-parameters for analysis of interconnects in 6-100 Gb/s applications. DesignCon 2010.

* cited by examiner

MEASURING EFFECTIVE DIELECTRIC CONSTANT USING VIA-STUB RESONANCE

TECHNICAL FIELD

The present disclosure relates generally to printed circuit boards, and more particularly, to measuring effective dielectric constant of a material.

BACKGROUND

Vias in printed circuit boards (PCBs) are a major cause of reflections. Not having the correct material dielectric constant (Dk) value for via modeling, results in via impedance to line impedance mismatch and hence reflections. Using conventional methods, measurement of Dk values may result in via impedance to line impedance mismatch by 5 Ohm or more, which may cause reflections and potentially eye failure for high-speed SerDes (Serializer/Deserializer). Thus, it is important to be able to correctly measure material Dk for vias.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1A:
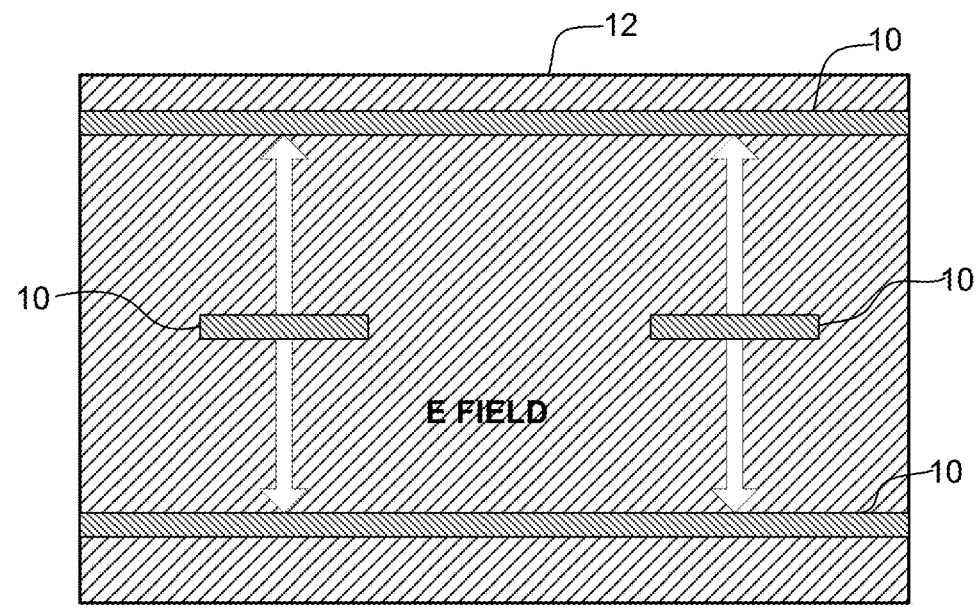
FIG. 1A illustrates vertical electric fields along a Z-axis for traces in a printed circuit board.

In one embodiment, an apparatus generally comprises a printed circuit board, a via-stub resonator formed in the printed circuit board, a plurality of vias surrounding the via-stub resonator, and a microstrip connected to the via-stub resonator for use in measuring an insertion loss to provide a resonance frequency. The via-stub resonator is designed to reproduce a dielectric constant value of a known material in a simulation. A via dielectric constant in an x and y plane is calculated based on the resonance frequency.

In one or more embodiments, the plurality of vias comprises at least two vias.

In one or more embodiments, a size of an anti-pad at the via-stub resonator is tuned in designing the via-stub resonator to provide a specified resonance frequency to reproduce the dielectric constant value of the known material in the simulation.

In one or more embodiments, an arrangement of the vias relative to the via-stub resonator is designed to minimize a distance between the vias and an edge of a via-stub resonator anti-pad on one or more layers of the printed circuit board.

In one or more embodiments, the via dielectric constant is used to match a via impedance to a line impedance and prevent reflections due to a mismatch.

In one or more embodiments, the via dielectric constant covers a via region in which capacitance between vias for an electric field is connected in parallel.

In one or more embodiments, the plurality of vias comprises at least six evenly spaced ground vias.

In another embodiment, a method generally comprises forming a via-stub resonator and a plurality of vias surrounding the via-stub resonator in a printed circuit board, wherein the via-stub resonator is connected to a microstrip, measuring an insertion loss at the microstrip, identifying a resonance frequency in the measured insertion loss, and calculating a via dielectric constant in an x and y plane based on the resonance frequency. The via-stub resonator is designed to reproduce a dielectric constant value of a known material in a simulation.

In yet another embodiment, a method generally comprises optimizing a via-stub structure design to obtain a specified dielectric constant value of a known material in simulation, wherein optimizing the via-stub structure design comprises selecting a size of a via-stub anti-pad and arrangement of a plurality of vias surrounding the via-stub structure, forming the via-stub structure and the plurality of vias in a printed circuit board, measuring an insertion loss, identifying a resonance frequency in the measured insertion loss, and calculating a via dielectric constant in an x and y plane based on the resonance frequency.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

When modeling vias in printed circuit boards (PCBs), it is important to have the correct material dielectric constant (Dk) (effective dielectric constant, relative dielectric constant, average dielectric constant). An incorrect Dk value may cause line to via impedance mismatch and hence reflections, which may potentially result in eye failure for high-speed SerDes (Serializer/Deserializer). The dielectric constant of a material containing traces may be measured between traces using conventional methods. Conventional techniques for measuring material Dk for traces are typically not applicable to vias since the fields have different structures, as described below.

Figure 1B:
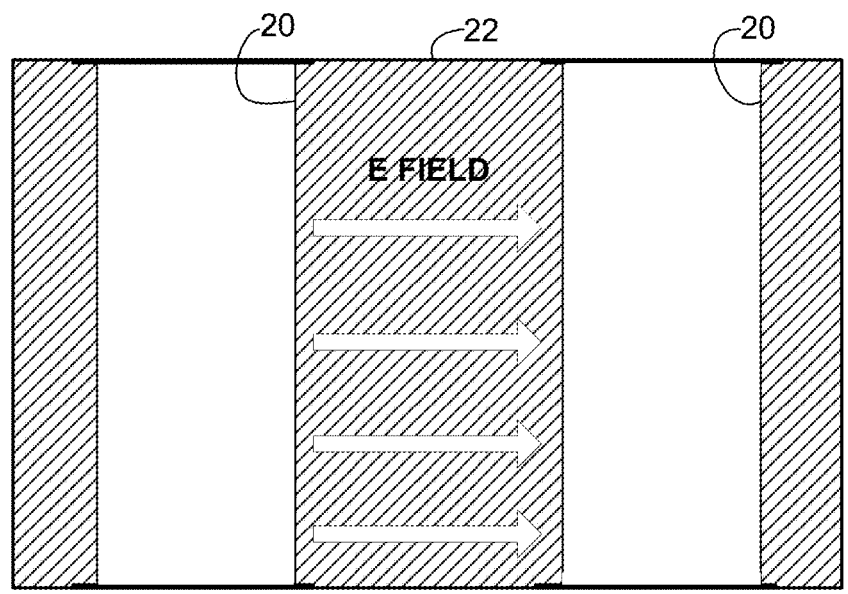
FIG. 1B illustrates electrical fields in an x/y plane in a printed circuit board with vias.
Figure 2A:
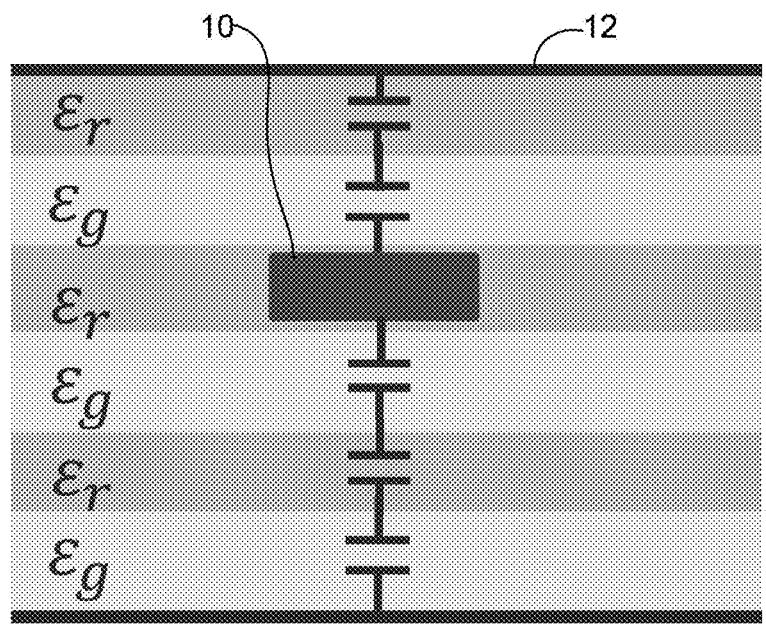
FIG. 2A illustrates capacitance connected in series for a trace with the electric field in a vertical direction.
Figure 2B:
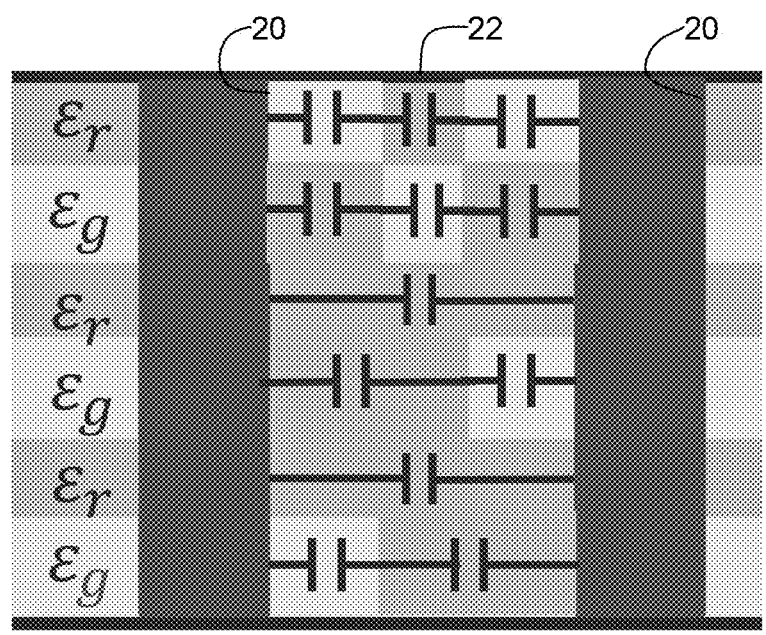
FIG. 2B illustrates capacitance connected in parallel for an electric field in the x/y plane between vias.

As shown in FIG. 1A, the electrical fields (E-Field) for traces 10 in a PCB 12 are vertical (as indicated by arrows in FIG. 1A) and Dk values may be obtained along a Z-axis ($Dk_z$). It is to be understood that the Dk value is an x, y, z value, however, in this case the Dk value may be dominant along the Z-axis, therefore it is referred to herein as $Dk_z$. FIG. 2A illustrates how capacitance is connected in series for the trace 10, as the electric field is in a vertical direction and the effective dielectric constant ($\varepsilon_r$, $\varepsilon_g$) for the glass and resin layers can be obtained. However, these techniques are not applicable to vias 20 due to a different electric field structure, as shown in FIG. 1B for PCB 22. The direction of the electric field in the via region is an x and y (x/y) plane (as indicated by arrows in FIG. 1B). The capacitance is therefore connected in parallel, as shown in FIG. 2B.

Due to geometry complications of glass/resin shapes in the via region, it is difficult to calculate an effective dielectric constant ($\varepsilon_r$, $\varepsilon_g$) for vias. Since vias are a major source of reflections near BGA (ball grid array) and at signal layer to layer transitions, an inaccurate Dk results in via impedance to line impedance mismatch. Impedance mismatch along a high speed signal path may cause reflections, which may decrease eye opening at a receiver. Reflections may, for example, appear 10s of UUs (Unit Intervals) away from the peak of a pulse in an impulse response representing a channel, thus receiver equalizers may not be able to compensate for them. One option is to include additional FFE (Feed Forward Equalizer) or DFE (Decision Feedback Equalizer) taps at the receiver; however, these are expensive in terms of power and die area. In order to reduce reflections, a correct value of Dk is needed for use in simulation to match impedance.

The embodiments described herein provide for correct measurement of a via dielectric constant for use in via modeling through utilization of a via-stub structure. As described below, the embodiments enable optimization of via impedance using simulation and reduce (or eliminate) reflections due to via impedance to line impedance mismatch in high speed channels.

As described in detail below, the via-stub structure enables proper measurement of a dielectric constant value for vias (e.g., for material in via region) (referred to herein as a via dielectric constant or $Dk_{xy}$). Correct via dielectric constant value allows for optimization of high-speed via impedance and matching to line impedance, thereby eliminating reflections due to via impedance to line impedance mismatch. This is often critical for high data rate SerDes (e.g., 56 Gbps and above) as in this case reflections due to via impedance mismatch play a significant role for eye closure at receivers. In one or more embodiments, reflections due to via to line impedance mismatch are significantly reduced, thereby providing BER (Bit Error Rate) improvement, allowing for increased channel lengths, and reducing use of FFE and DFE tabs at the receiver, which reduces power consumption.

Figure 3:
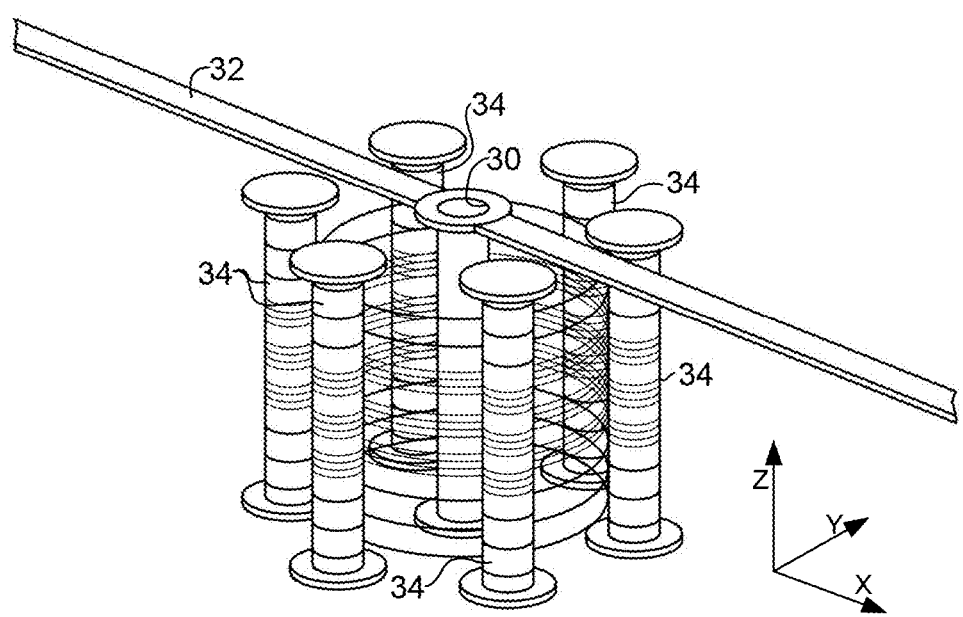
FIG. 3 is a dimetric view of a plurality of vias and a via-stub resonator used in measuring via dielectric constant, in accordance with one embodiment.
Figure 4:
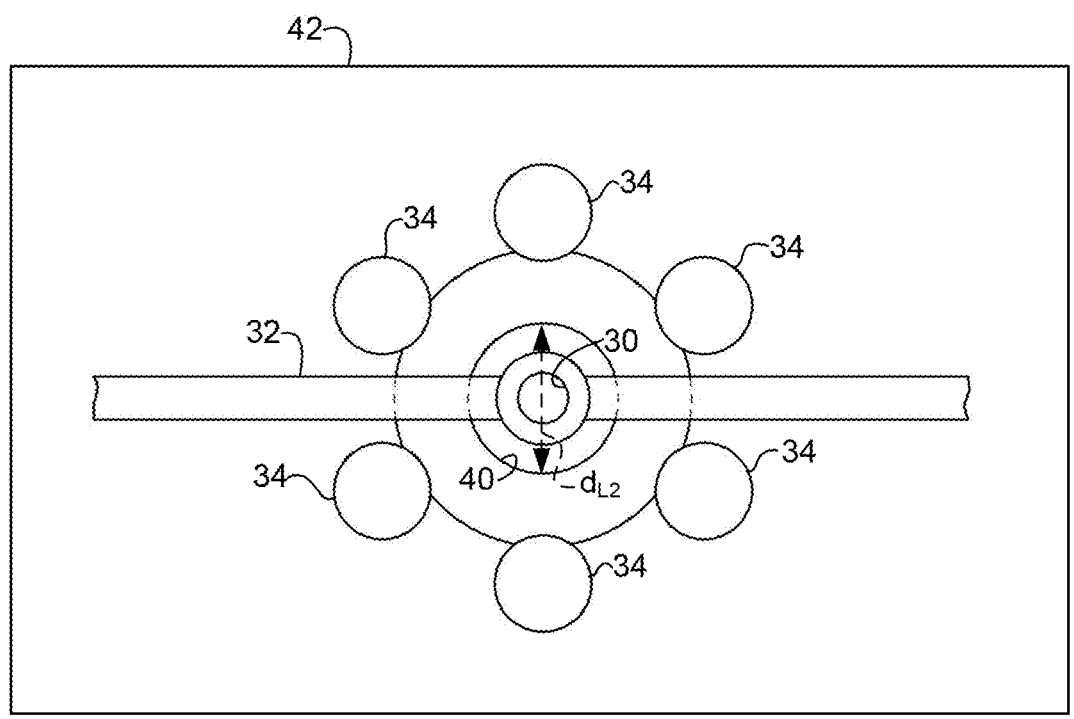
FIG. 4 is a top view of the via-stub resonator and vias shown in FIG. 3.
Figure 5:
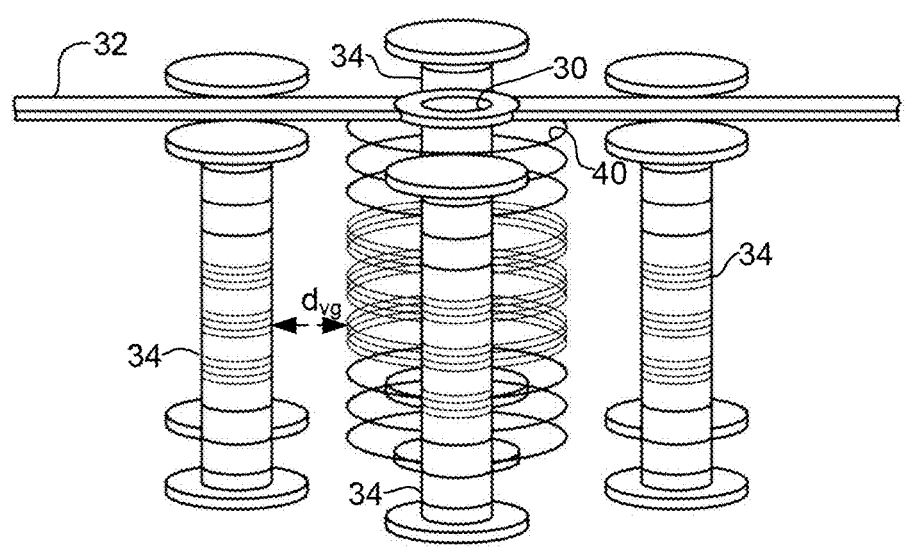
FIG. 5 is top perspective of the via-stub resonator and vias of FIG. 3.

Referring now to FIGS. 3, 4, and 5 a via-stub structure (also referred to herein as a via-stub resonator) 30 is shown connected to a microstrip (microstrip trace, line) 32 for use in obtaining via $Dk_{xy}$ (dielectric constant for via). The microstrip 32 may be located at the top or bottom of the PCB and measurements may be taken at the end of the microstrip. The via-stub resonator 30 is surrounded by a plurality of vias 34 (e.g., ground vias, power vias). In the example shown in FIGS. 3-5, the via-stub resonator 30 is surrounded by six vias 34; however any number of vias (e.g., two or more, four to six) may be used. For clarity, at least some insulating material and layers have been removed in FIGS. 3, 4, and 5. It is to be understood that the arrangement of the via-stub resonator 30 and vias 34 shown in FIGS. 3-5 and described herein is only an example and other arrangements or number of vias may be used, without departing from the scope of the embodiments.

A printed circuit board (e.g., 22 in FIG. 2B, 42 in FIG. 4, circuit board, portion of a circuit board, printed board, circuit board panel, printed circuit board assembly) comprises multiple layers of conductive and nonconductive materials, with each layer defining a plane of the circuit board. One or more nonconductive layers may have a surface coated with a conductive material. Portions of the conductive material may be removed to define conductive portions on the surface, which are referred to as traces (e.g., 10 in FIGS. 1A and 2A). The traces define circuit paths on the circuit board that make an electrical connection between two or more points on the PCB. The layers typically include at least one signal plane, at least one ground plane, and at least one power plane. Outermost layers (top and bottom) of the PCB may have components mounted on their surfaces (not shown). In one example, the PCB may operate, for example, with data rates of 28 Gbps (or more or less) for NRZ signaling and 56 Gbps (or more or less) for PAM (Pulse Amplitude Modulation)-4 signaling.

The printed circuit board further includes a plurality of through holes (vias) (e.g., 20 in FIGS. 1B and 2B), through which the different conductive layers are connected together. The vias typically extend through the entire thickness of the circuit board and are plated along their interior surfaces. The through hole may, for example, be created using a drilling process and plated with a metallic material (e.g., copper or any conductive or metallic layer). The plating may effectively cover the barrel of the hole and interconnect the various conductive layers. The traces may be connected through the vias. For example, the vias may interconnect traces on different PCB layers and connect layers to power or ground planes.

As previously described above with respect to FIGS. 1A and 1B, conventional methods for measuring Dk for traces are not typically applicable to vias since the electric fields have different structures. The via stub-resonator 30, shown in FIGS. 3-5, provides a way to measure Dk for use in via modeling. The measured $Dk_{xy}$ is an effective (average) Dk as a result of an effective electric field in the via structure. Local variations of $Dk_{xy}$, if only within dielectric layers, will not have an impact as the vias will see it as averaged over multiple layers. The via-stub resonator 30 and measurement process described herein may be implemented in test units or on production boards since the small via-stub structure does not take up very much area on the PCB.

Figure 6:
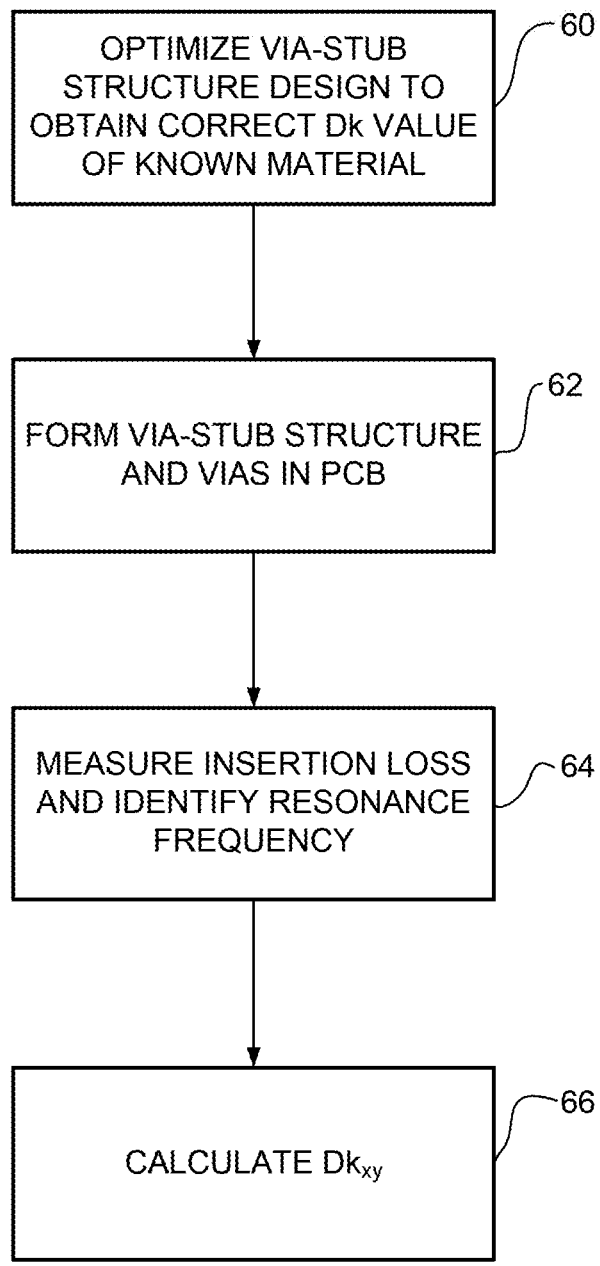
FIG. 6 is a flowchart illustrating an overview of a process for using the via-stub resonator to measure the via dielectric constant, in accordance with one embodiment.

FIG. 6 illustrates an overview of a process for determining via $Dk_{xy}$, in accordance with one embodiment. At step 60, the via-stub structure 30 is designed and optimized to obtain correct Dk (specified dielectric constant value) of known material in a simulation. As described below, optimizing the via-stub structure design may include selecting a via-stub anti-pad size and arrangement of the plurality of vias 34 surrounding the via-stub structure 30 (FIGS. 3-6). The designed via-stub structure 30 is then implemented in the PCB 42 (step 62) (FIGS. 4 and 6). This comprises forming (e.g., drilling or other process for creating vias) the via-stub resonator (structure) 30 and the vias 34 in the printed circuit board 42. As previously described, the via-stub structure 30 is connected to the microstrip 32. Insertion loss is measured at the microstrip 32 and a resonance frequency is identified in the measured insertion loss (step 64). The Dk value (via dielectric constant in an x and y plane) is calculated based on the resonance frequency (step 66). Details of steps shown in FIG. 6 are described below.

It is to be understood that the process shown in FIG. 6 and described herein is only an example and steps may be added, combined, or modified, without departing from the scope of the embodiments.

In one or more embodiments, the via-stub resonator 30 is designed using a simulation. In one example, the via-stub resonator 30 is designed to be as long as possible (FIGS. 3-5). In the example described herein, the via-stub resonator 30 is surrounded by six evenly spaced ground vias 34. As previously described, this is only an example and other arrangements may be used.

Figure 7A:
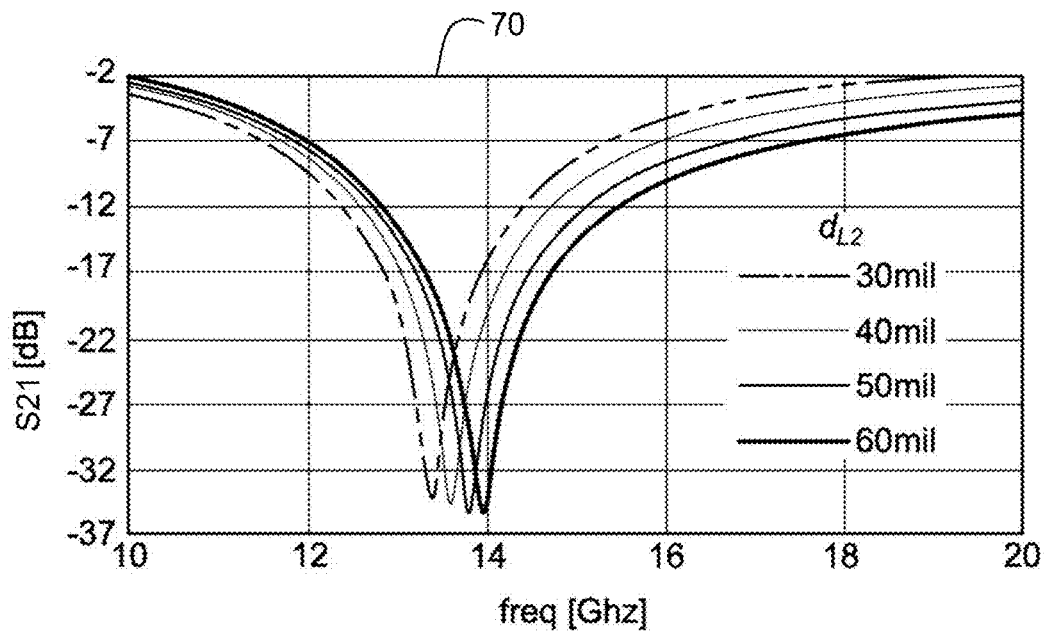
FIG. 7A is a graph illustrating simulated insertion loss for various via-stub anti-pad sizes.

As shown in the top view of FIG. 4, a via-stub anti-pad 40 is formed around the via-stub resonator 30. The anti-pad 40 is a clearance area in a plane (e.g., copper plane) through which a hole may be drilled or otherwise pass without making a connection (e.g., clearance between via-stub resonator 30 and metal layer to which it is not connected). A portion of the underlying plane area that surrounds the via-stub resonator 30 is removed to form an opening, referred to as the anti-pad 40. In one or more embodiments, the anti-pad size (diameter $d_{L2}$ in FIG. 4) is tuned on layer 2 to have a correct resonance frequency and reproduce Dk value of known material used in the simulation. FIG. 7A illustrates a graph 70 showing insertion loss (scattering parameter S21 (dB)) versus frequency (Ghz) for different values of $d_{L2}$. In this example, graph 70 shows simulated insertion loss for anti-pad diameter ($d_{L2}$) of 30 mil, 40 mil, 50 mil, and 60 mil at layer to 2 to align Dk value to a correct (specified, known) resonance frequency for a known material.

Figure 7B:
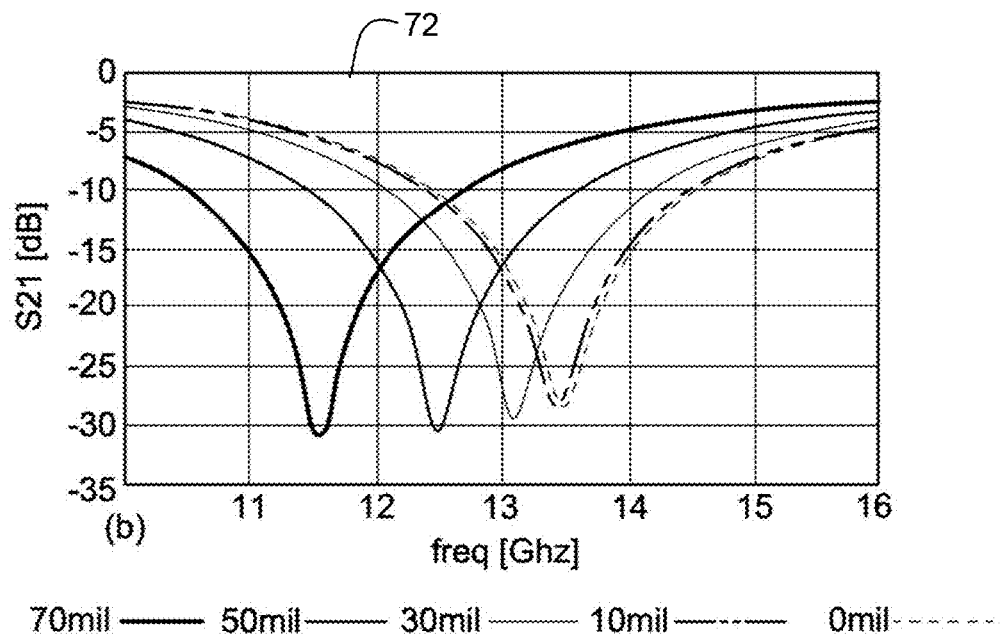
FIG. 7B is a graph illustrating simulated insertion loss for various distances between an anti-pad edge and the vias.

As shown in FIG. 5, the vias 34 may be positioned to have a minimum distance $d_{vg}$ between the vias (e.g., ground vias) and the anti-pad edge on layers below layer 2. Graph 72 of FIG. 7B shows simulated insertion loss for various values of distances $d_{vg}$ (0 mil, 10 mil, 30 mil, 50 mil, 70 mil) between anti-pad edge and vias 34 to achieve saturation. The vias 34 are positioned closer to the via-stub resonator 30 to provide sharp resonance.

The insertion loss and resonance frequency shown in FIGS. 7A and 7B for use in obtaining correct dielectric constant value (Dk) of known material in simulation is used to properly design and optimize the stub-resonator and is not to be confused with the via dielectric constant ($Dk_{xy}$), which is obtained through calculations based on resonance frequency from actual insertion loss measurements on the manufactured PCB (or test PCB) containing the designed via-stub resonator, via-stub anti-pad, and surrounding vias.

Once the via-stub resonator 30, via-stub anti-pad size, and arrangement of the vias 34 relative to the via-stub resonator is established (design optimized in step 60), the design is implemented in the PCB 42 (step 62) (FIGS. 4 and 6). The following describes details for measurement and calculation in steps 64 and 66 for use in determining $Dk_{xy}$, in accordance with one embodiment.

Figure 8:
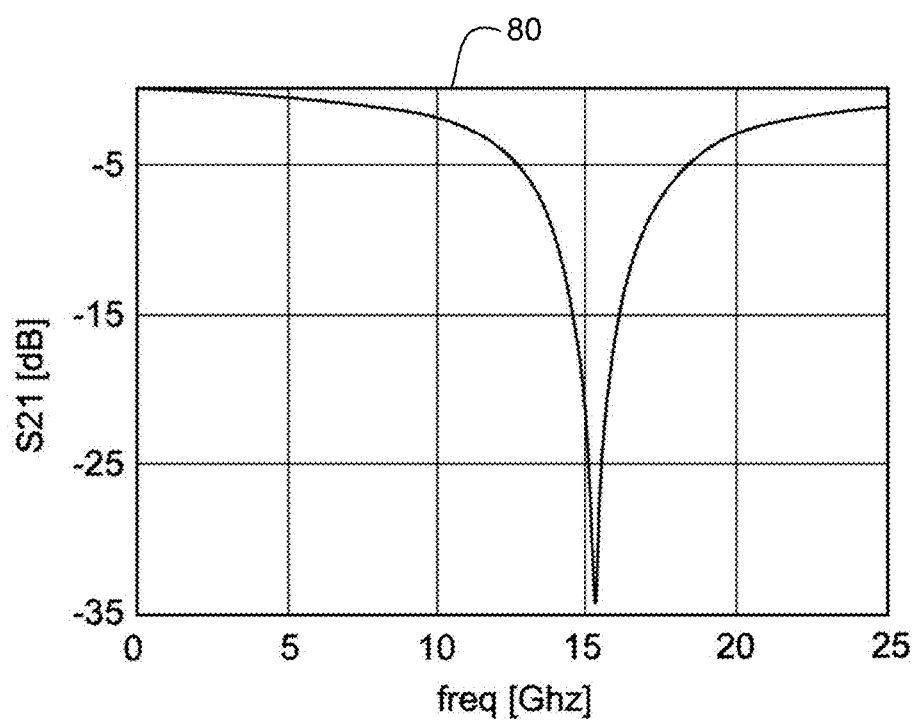
FIG. 8 is a graph of measured insertion loss for use in identifying a resonance frequency.

The insertion loss is measured at the microstrip 32 in the PCB 42 (FIG. 4) and resonance frequency is identified, as shown in the example insertion loss graph 80 of FIG. 8. In one or more embodiments, the following equation may be used with the identified resonance frequency to calculate $Dk_{xy}$:

$$Dk = \left(\frac{c_0}{4Lf_{res}}\right)^2$$

Wherein:
$f_{res}$ is resonance frequency in the measured insertion loss;
$c_0$ is speed of light in vacuum; and
L is length of the via-stub resonator.

Figure 9:
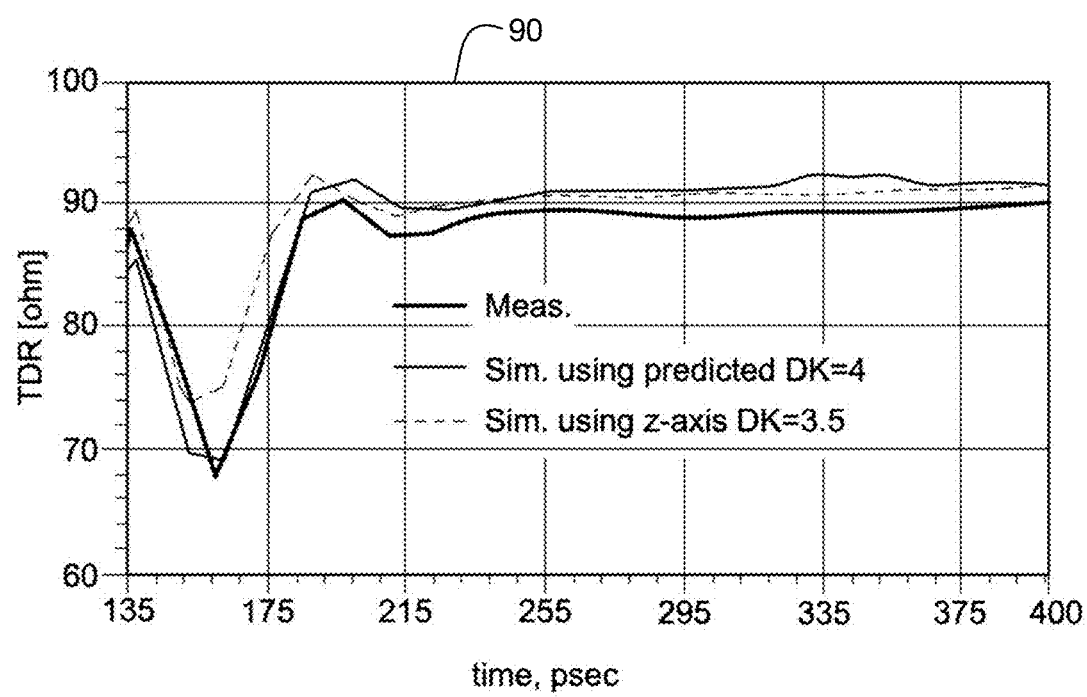
FIG. 9 is a graph comparing simulated TDR (Time Domain Reflectometry) obtained using the via-stub resonator and measurements.

FIG. 9 illustrates an example of simulated TDR (Time Domain Reflectometry) using a value of $Dk_{xy}$=4 obtained using the above described via-stub resonator 30, showing that the simulated results correlate well with measurements. For comparison, a simulation using conventional z-axis measurement of $Dk_z$=3.5 is also shown.

The embodiments described herein may be implemented, for example, in a test PCB or a production PCB in a network device (e.g., router, switch) to provide improved $Dk_{xy}$ measurements for use in via modeling. The network device may be a programmable machine implemented in hardware, software, or any combination thereof, and may include one or more processors, memory, and network interfaces.

The via-stub structure 30 and measurement process described herein provide an accurate $Dk_{xy}$, which may be used in via modeling to match via impedance to line impedance and prevent reflections due to a mismatch. The reduced reflections provide BER improvement, allow for increased channel lengths, and reduce PCB costs and power consumption.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
a printed circuit board;
a via-stub resonator formed in the printed circuit board;
a plurality of vias surrounding the via-stub resonator; and
a microstrip connected to the via-stub resonator for use in measuring an insertion loss to provide a resonance frequency;
wherein the via-stub resonator is designed to reproduce a dielectric constant value of a known material in a simulation and wherein a via dielectric constant in an x and y plane is calculated based on said resonance frequency.

2. The apparatus of claim 1 wherein said plurality of vias comprises at least two vias.

3. The apparatus of claim 1 wherein a size of an anti-pad at the via-stub resonator is tuned in designing the via-stub resonator to provide a specified resonance frequency to reproduce said dielectric constant value of said known material in said simulation.

4. The apparatus of claim 1 wherein an arrangement of said plurality of vias relative to the via-stub resonator is designed to minimize a distance between said plurality of vias and an edge of a via-stub resonator anti-pad on one or more layers of the printed circuit board.

5. The apparatus of claim 1 wherein said via dielectric constant is calculated according to:

$$Dk = \left(\frac{c_0}{4Lf_{res}}\right)^2;$$

wherein:
$f_{res}$ is said resonance frequency in said measured insertion loss;
$c_0$ is a speed of light in a vacuum; and
L is a length of the via-stub resonator.

6. The apparatus of claim 1 wherein said via dielectric constant is used in via modeling to match a via impedance to a line impedance and prevent reflections due to a mismatch.

7. The apparatus of claim 1 wherein said via dielectric constant covers a via region in which capacitance between said vias for an electric field is connected in parallel.

8. The apparatus of claim 1 wherein said plurality of vias comprises at least six evenly spaced ground vias.

9. A method comprising:
forming a via-stub resonator and a plurality of vias surrounding the via-stub resonator in a printed circuit board, wherein the via-stub resonator is connected to a microstrip;
measuring an insertion loss at the microstrip;
identifying a resonance frequency in said measured insertion loss; and
calculating a via dielectric constant in an x and y plane based on said resonance frequency;
wherein the via-stub resonator is designed to reproduce a dielectric constant value of a known material in a simulation.

10. The method of claim 9 wherein said plurality of vias comprises at least four vias.

11. The method of claim 9 wherein a size of an anti-pad at the via-stub resonator is tuned in designing the via-stub resonator to provide a specified resonance frequency in said simulation.

12. The method of claim 9 wherein an arrangement of said plurality of vias relative to the via-stub resonator is designed to minimize a distance between said plurality of vias and an edge of a via-stub resonator anti-pad on one or more layers of the printed circuit board.

13. The method of claim 9 wherein said via dielectric constant is calculated according to:

$$Dk = \left(\frac{c_0}{4Lf_{res}}\right)^2;$$

wherein:
$f_{res}$ is said resonance frequency in said measured insertion loss;
$c_0$ is a speed of light in a vacuum; and
L is a length of the via-stub resonator.

14. The method of claim 9 wherein said via dielectric constant is used in via modeling to match a via impedance to a line impedance and prevent reflections due to a mismatch.

15. The method of claim 9 wherein said via dielectric constant covers a via region in which capacitance between said vias for an electric field is connected in parallel.

16. The method of claim 9 wherein said plurality of vias comprises at least six evenly spaced ground vias.

17. A method comprising:
optimizing a via-stub structure design to obtain a specified dielectric constant value of a known material in simulation, wherein optimizing said via-stub structure design comprises selecting a size of a via-stub anti-pad and an arrangement of a plurality of vias surrounding the via-stub structure;
forming the via-stub structure and said plurality of vias in a printed circuit board;
measuring an insertion loss;
identifying a resonance frequency in said measured insertion loss; and
calculating a via dielectric constant in an x and y plane based on said resonance frequency.

18. The method of claim 17 wherein the size of the via-stub anti-pad is tuned in optimizing the via-stub structure to provide a specified resonance frequency in said simulation.

19. The method of claim 17 wherein said arrangement of said plurality of vias relative to the via stub structure is designed to minimize a distance between said plurality of vias and an edge of the via-stub anti-pad on one or more layers of the printed circuit board.

20. The method of claim 17 wherein said plurality of vias comprises at least six evenly spaced ground vias.

* * * * *